US007563149B2

(12) United States Patent
Kim et al.

(10) Patent No.: US 7,563,149 B2
(45) Date of Patent: Jul. 21, 2009

(54) SHEET FOR MANUFACTURING PLASMA DISPLAY APPARATUS AND METHOD FOR MANUFACTURING PLASMA DISPLAY

(75) Inventors: Je Seok Kim, Anyang-si (KR); Dae Hyun Park, Yongin-si (KR)

(73) Assignee: LG Electronics Inc., Seoul (KR)

( * ) Notice: Subject to any disclaimer, the term of this patent is extended or adjusted under 35 U.S.C. 154(b) by 511 days.

(21) Appl. No.: 11/206,844

(22) Filed: Aug. 19, 2005

(65) Prior Publication Data

US 2006/0038955 A1 Feb. 23, 2006

(30) Foreign Application Priority Data

Aug. 20, 2004 (KR) ...................... 10-2004-0066094

(51) Int. Cl.

| | |
|---|---|
| ***H05K 3/06*** | (2006.01) |
| ***G03F 7/00*** | (2006.01) |
| ***B32B 7/02*** | (2006.01) |
| ***H01J 9/02*** | (2006.01) |
| ***H01J 9/18*** | (2006.01) |

(52) U.S. Cl. ......................... 445/46; 430/496; 430/501; 428/98; 29/829; 445/49

(58) Field of Classification Search ................. 430/501, 430/496; 428/98; 29/825, 829, 831; 445/35, 445/46, 49

See application file for complete search history.

(56) References Cited

U.S. PATENT DOCUMENTS

| | | | | |
|---|---|---|---|---|
| 6,207,268 | B1 * | 3/2001 | Kosaka et al. | 428/325 |
| 2005/0159070 | A1 * | 7/2005 | Banba et al. | 445/24 |
| 2005/0277354 | A1 * | 12/2005 | Buzoujima et al. | 445/24 |
| 2006/0275950 | A1 * | 12/2006 | Lee | 438/107 |

FOREIGN PATENT DOCUMENTS

| | | |
|---|---|---|
| JP | 2000-195419 | 7/2000 |
| KR | 1020010083319 A | 9/2001 |

* cited by examiner

*Primary Examiner*—Evan Pert
(74) *Attorney, Agent, or Firm*—McKenna Long & Aldridge LLP

(57) ABSTRACT

Provided are a sheet for manufacturing a plasma display apparatus, and a method for manufacturing the plasma display apparatus. The sheet includes a base film; a photoresist layer formed on the base film; an electrode material layer formed on the photoresist layer; and a cover film formed on the electrode material layer.

13 Claims, 9 Drawing Sheets

SHEET FOR MANUFACTURING PLASMA DISPLAY APPARATUS AND METHOD FOR MANUFACTURING PLASMA DISPLAY

This Nonprovisional application claims priority under 35 U.S.C. § 119(a) on Patent Application No. 10-2004-0066094 filed in Korea on Aug. 20, 2004, the entire contents of which are hereby incorporated by reference.

BACKGROUND OF THE INVENTION

1. Field of the Invention

The present invention relates to a front substrate of a plasma display panel, and more particularly, to a method for manufacturing a bus electrode of a front substrate of a plasma display panel, using a sheet.

2. Description of the Background Art

FIG. 1 is an exploded perspective view illustrating a conventional plasma display apparatus.

As shown in FIG. 1, the conventional plasma display apparatus is comprised of a front substrate 10 and a rear substrate 20. The front substrate 10 and the rear substrate 20 are spaced apart from each other and attached in parallel.

A plurality of scan electrodes (11_scan) is arrayed to be in parallel with one another on the front substrate 10. The plurality of scan electrodes (11_scan) are comprised of a transparent electrode (or ITO electrode) (11*a*_scan) that is formed of indium tin oxide (ITO), and a bus electrode (11*b*_scan), which is on the transparent electrode (11*a*_scan), that is formed of metal, such as silver (Ag).

A sustain electrode (11_sustain) is paired with the scan electrode (11_scan) and arrayed on the front substrate 10. The sustain electrode (11_sustain) is comprised of a transparent electrode (or ITO electrode)(11*a*_sustain), and a bus electrode (11*b*_sustain), which is located in the same way as the scan electrode (11_scan), that is formed of metal, such as silver (Ag), A dielectric layer 12 limits discharge current, and serves as an insulater between the scan electrode (11_scan) and the sustain electrode (11_sustain).

A protective layer 13 is formed by depositing magnesium oxide (MgO) on the dielectric layer 12, to facilitate emission of secondary electrons and to protect the scan electrode (11_scan) and the sustain electrode (11_sustain).

The rear substrate 20 has stripe-typed (or well-typed) barrier ribs 21 arrayed and maintained in parallel and forming a plurality of discharge spaces, that is, a plurality of cells.

The address electrode 22 is disposed to be in parallel with the barrier rib 21, and performs an address discharge and generates vacuum ultraviolet rays at an intersection of the scan electrode (11_scan) and the sustain electrode (11_sustain).

At the rear substrate 20, red, green, and blue phosphor layers 23 emitting visible rays for image display are coated between the barrier ribs 21, and the dielectric layer 24 is fired and formed on the address electrode 22.

FIG. 2 is a sectional view illustrating another conventional plasma display apparatus.

It is known that a bus electrode comprised of silver (Ag) reflects light incident from the outside and obstructs light resulting from discharge, thereby deteriorating contrast. To solve this problem, a black layer 11*c* for improving the contrast is formed between a transparent electrode 11*a* and a bus electrode 11*b*. Further, a black matrix 14 formed between electrode pairs, absorbs the external light generated from the external of the front substrate 10 and reduces reflection of the external light, thereby improving purity and contrast of the front substrate 10. A reference numeral 12 denotes a dielectric layer.

A method for manufacturing the front substrate 10 of the above-identified conventional plasma display apparatus will be described below.

FIGS. 3A to 3D illustrate the conventional screen printing method used for manufacturing the front substrate of the plasma display apparatus, using a screen printing method.

As shown in FIG. 3A, a black paste 35 for forming the black layer 11*c* is coated on a screen mask 30, and then the black paste 35 is pushed down using a squeegee 37. The screen mask 30 is comprised of a mesh net 33 generally formed of metal, and a pattern forming layer 31 having a pattern for the black layer 11*c*.

If the black paste 35 is pushed down using the squeegee 37, the black paste 35 is moved through a hole 34 in the pattern forming layer 31 of the screen mask 30, thereby forming the black layer 11*c* on the transparent electrode 11*a* as shown in FIG. 3B. After the black layer 11*c* is formed, the black layer 11*c* is cured in a light curing method using ultraviolet rays or a thermal curing method using heat.

After the black layer 11*c* has cured, as shown in FIG. 3C, a silver (Ag) paste 39 for forming the bus electrode 11*b* is coated on the mesh net 33 of the screen mask 30 and then, the silver paste 39 is pushed down using the squeegee 37.

If the silver paste 39 is pushed down using the squeegee 37, the silver paste 39 is moved through the hole 34 provided in the pattern of the pattern forming layer 31 of the screen mask 30, thereby forming the bus electrode 11*b* on the black layer 11*c*. After the silver electrode layer 11*b* is formed, the silver electrode layer 11*b* is cured in the light curing method using the ultraviolet rays or the thermal curing method using the heat, and the black layer 11*c* and the silver electrode layer 11*b* are fired.

The screen mask 30 that is used for forming the electrode of the front substrate 10 through the screen printing method, increases in size as the plasma display panel increases in size. In a case where the electrode is formed through the screen printing method as mentioned above, a curing process needs to be performed after the forming of the electrode and therefore, such need for curing creates an addional complication to the plasma display apparatus manufacturing process that adds significantly to the plasma display apparatus' manufacturing time and cost.

In a case where the electrode is formed through the screen printing method, an additional problem occurs in that it is difficult to more precisely and minutely form the electrode pattern as the plasma display apparatus' resolution increases.

SUMMARY OF THE INVENTION

Accordingly, an object of the present invention is to solve at least the problems and disadvantages of the background art.

An object of the present invention is to provide a means and a manufacturing method being capable of replacing the screen printing method used for electrode forming.

In accordance with the present invention, as embodied and broadly described, there is provided a sheet for manufacturing a plasma display apparatus, the sheet including: a base film; a photoresist layer formed on the base film; an electrode material layer formed on the photoresist layer; and a cover film formed on the electrode material layer.

In another aspect of the present invention, there is provided a sheet for manufacturing a plasma display apparatus, the sheet including: a base film; a photoresist layer formed on the base film; an electrode material layer formed on the photoresist layer; a black material layer formed on the electrode material layer; and a cover film formed on the black material layer.

In a further another aspect of the present invention, there is provided a method for manufacturing a plasma display apparatus using a sheet, the method including the steps of: exposing the black material layer, using a first photo mask; preparing a glass substrate; laminating the exposed black material layer over the glass substrate; laminating a photoresist layer on the sheet, and exposing the laminated photoresist layer using a second photo mask; and developing the exposed photoresist layer, and forming a black layer positioned over the glass substrate and an electrode positioned on the black layer.

The present invention forms the electrode using the sheet, thereby solving the problem of large sized screen masks and the deformation problem that results when the screen mask is used numerous times in the manufacturing process.

The present invention forms the electrode using the sheet 110, thereby allowing for the manufacture of large sized plasma display apparatus while also being useful for a multi-panel production process.

The present invention's use of the sheet to form the electrode results in a reduction of the plasma display apparatus' manufacturing time and cost due to the simplification of the manufacturing process, in comparison to the conventional screen printing method using the screen mask.

The present invention forms the electrode using the sheet through the exposure process, thereby allowing the forming of a highly precise electrode pattern that had previously been difficult to form using the screen printing method.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

A sheet for manufacturing a plasma display apparatus according to the present invention, includes a base film; a photoresist layer formed on the base film; an electrode material layer formed on the photoresist layer; and a cover film formed on the electrode material layer.

The electrode material layer is comprised of silver (Ag).

A sheet for manufacturing a plasma display apparatus according to the present invention, includes a base film; a photoresist layer formed on the base film; an electrode material layer formed on the photoresist layer; a black material layer formed on the electrode material layer; and a cover film formed on the black material layer.

The electrode material layer is comprised of silver (Ag).

It is characterized in that the black material layer is a photosensitive black material layer.

A method for manufacturing a plasma display apparatus using a sheet according to the present invention, includes the steps of: exposing the black material layer, using a first photo mask; preparing a glass substrate; laminating the exposed black material layer over the glass substrate; laminating a photoresist layer on the sheet, and exposing the laminated photoresist layer using a second photo mask; and developing the resultant, and forming a black layer positioned over the glass substrate and an electrode positioned on the black layer.

The method further includes the step of: lifting off the cover film before the exposure is performed using the first photo mask.

The method further includes the step of: lifting off the cover film after the exposure is performed using the first photo mask.

The method further includes the step of: after the forming of the black layer and the electrode, firing the formed black layer and electrode.

The black material layer is a photosensitive black material layer.

The electrode material layer is comprised of silver (Ag).

The exposed black material layer is laminated on the glass substrate having the transparent electrode formed thereon.

The exposed black material layer is laminated on the glass substrate that has the transparent electrodes formed thereon and having a black matrix formed therebetween.

Preferred embodiments of the present invention will be described in a more detailed manner with reference to the drawings.

Embodiment 1

Figure 1:
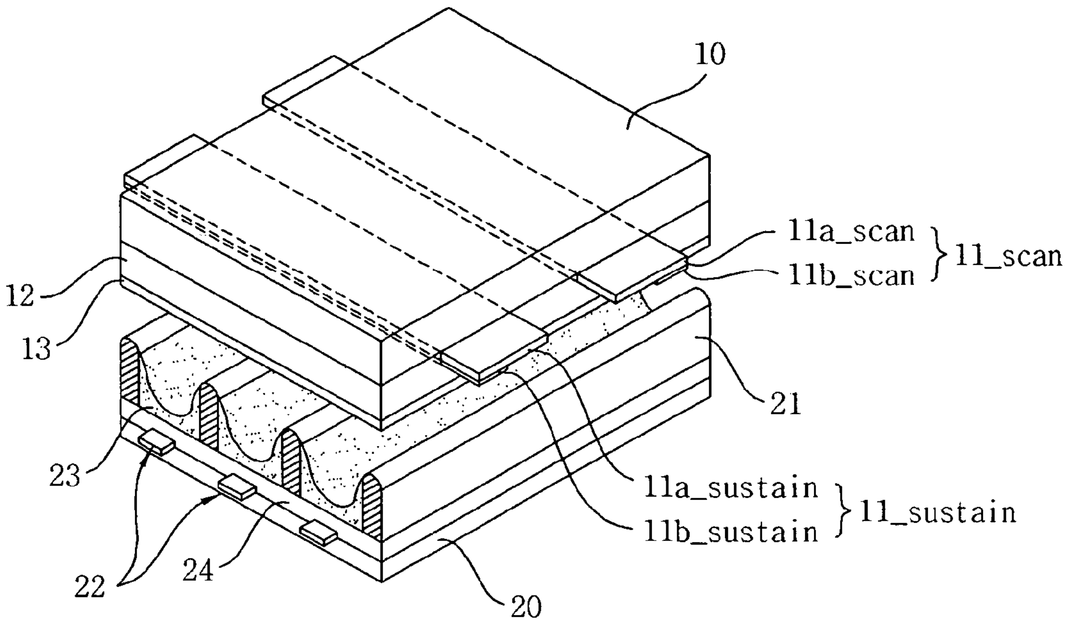
FIG. 1 is an exploded perspective view illustrating a conventional plasma display apparatus.
Figure 2:
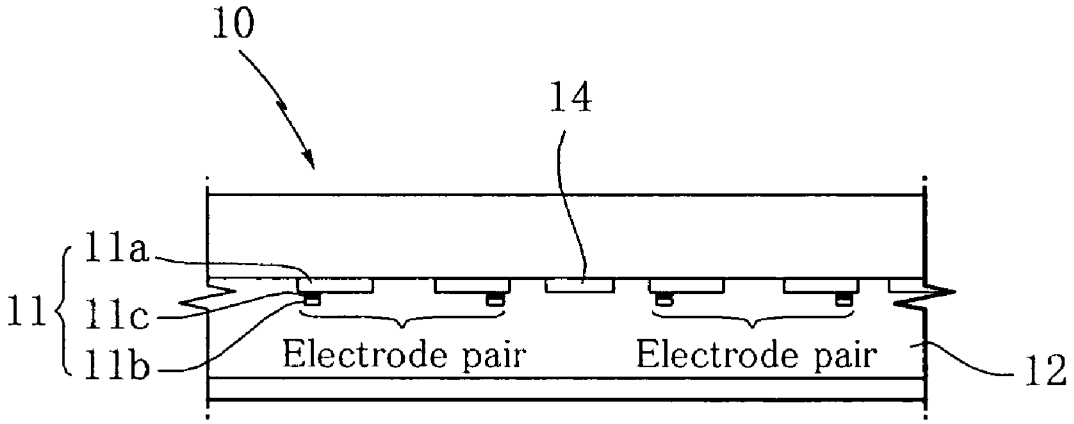
FIG. 2 is a sectional view illustrating another conventional plasma display apparatus.
Figure 3A:
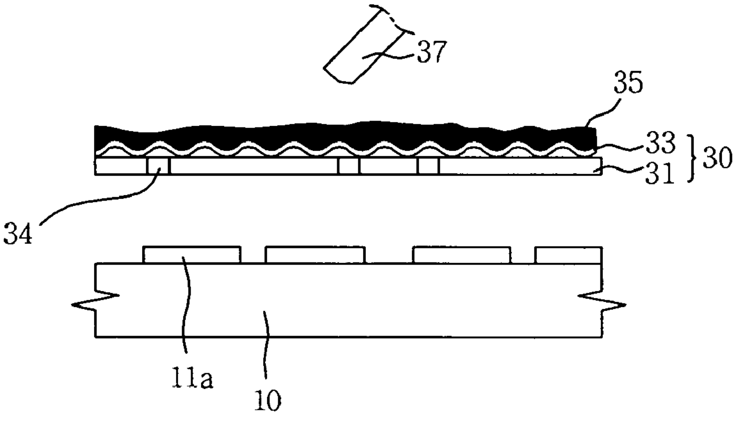
FIGS. 3A to 3D illustrate the conventional screen printing method for manufacturing a front substrate of a plasma display apparatus using a screen printing method.
Figure 3B:
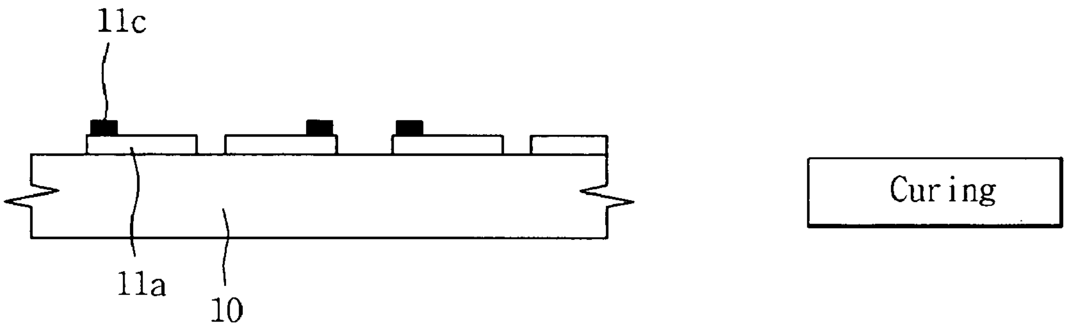
Figure 3C:
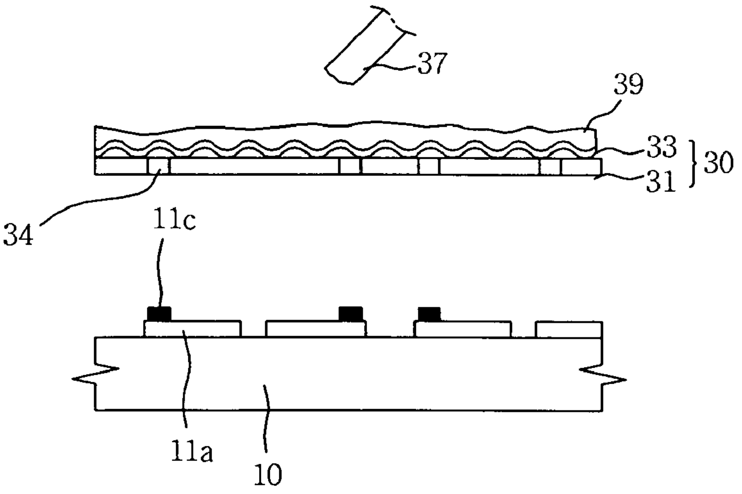
Figure 3D:
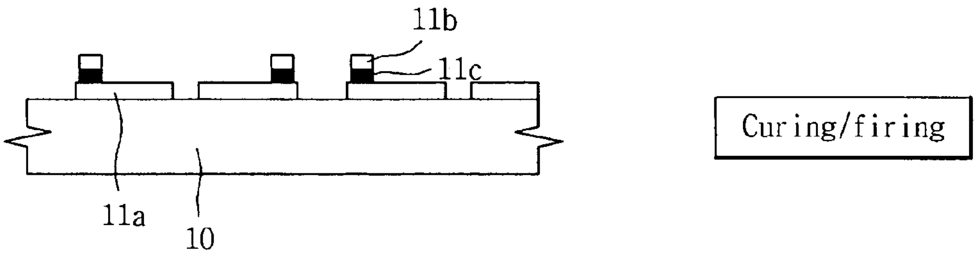
Figure 4:
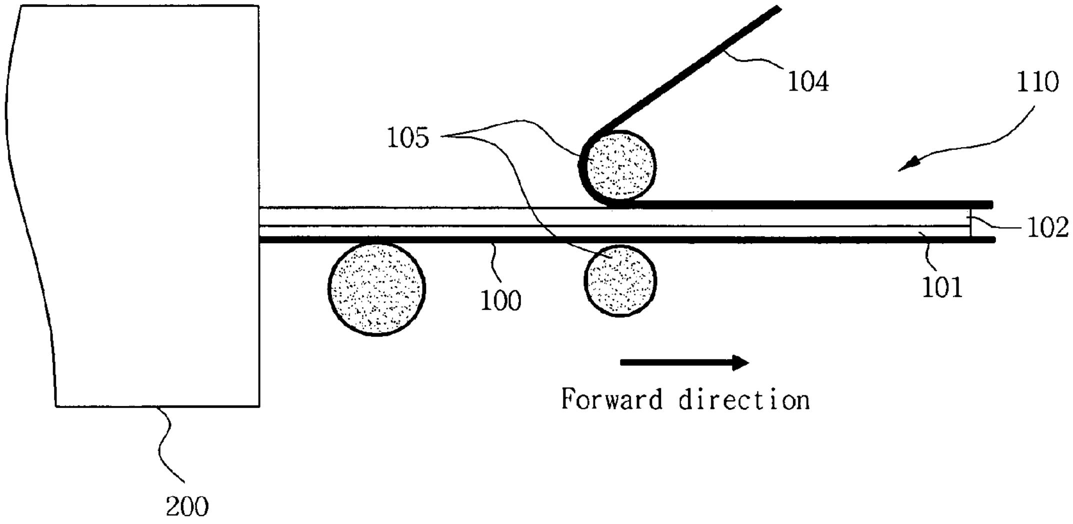
FIG. 4 illustrates a manufacturing method and the structure of a sheet according to the first embodiment of the present invention.

FIG. 4 illustrates a manufacturing method and the structure of a sheet according to the first embodiment of the present invention.

As shown in FIG. 4, the inventive sheet 110 includes a base film 100, a photoresist layer 101, an electrode material layer 102, and a cover film 104.

The base film 100 is disposed at the lowermost portion of the sheet 110. The photoresist layer 101 is formed on the base film 100. The electrode material layer 102 is formed on the photoresist layer 101. The cover film 104 is formed on the electrode material layer 102. The electrode material layer 102 for forming an electrode is comprised of silver (Ag).

The inventive sheet 110 is formed using a tape caster 200. The tape caster 200 forwards the base film 100 in a direction of an arrow of FIG. 4 while casting the photoresist layer 101 and the electrode material layer 102 on the base film 100. Next, the tape caster 200 enables the base film 100 including the earlier casted photoresist layer 101 and electrode material layer 102 to pass between two laminating rolls 105. The laminating rolls 105 are disposed up and down and spaced apart from each other, and laminate the cover film 104 on the electrode material layer 102 and complete the sheet 110.

FIGS. 5A to 5G illustrate an electrode manufacturing method using the sheet according to the first embodiment of the present invention.

Figure 5A:
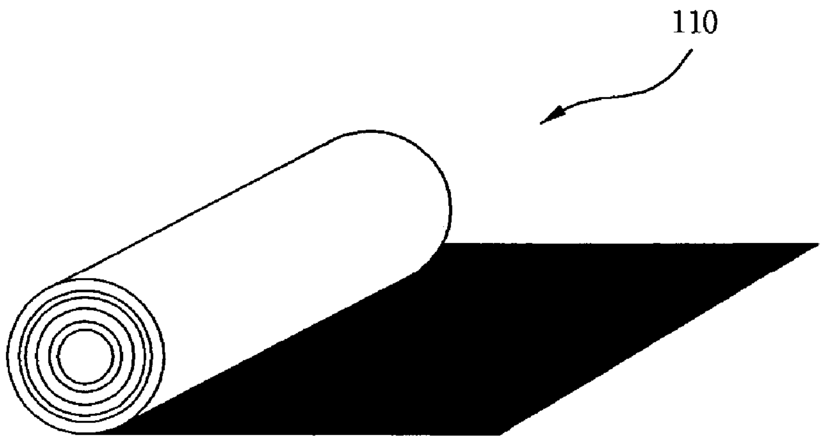
FIGS. 5A to 5G illustrate an electrode manufacturing method using a sheet according to the first embodiment of the present invention.

Referring to FIG. 5A, the sheet 110 for forming a bus electrode at a front substrate of a plasma display apparatus is formed by sequentially laminating the base film 100, the photoresist layer 101, the electrode material layer 102, and the cover film 104 as shown in FIG. 4.

Figure 5B:
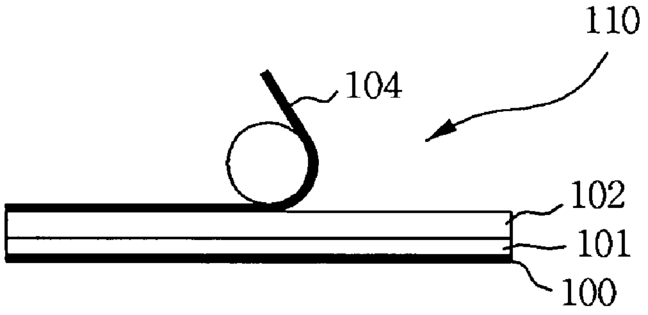
Figure 5C:
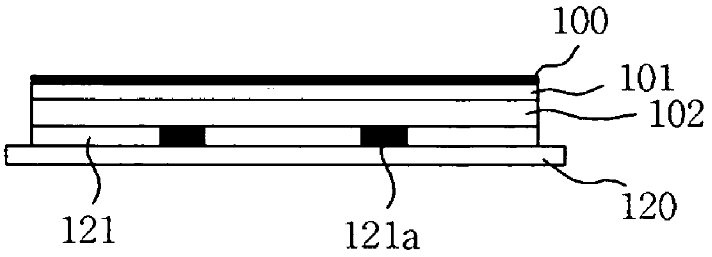

Then, as shown in FIG. 5B, the cover film 104 is removed from the sheet 110. Upon the removal of the cover film 104, as shown in FIG. 5C, the electrode material layer 102 of the sheet 110 is laminated on a glass substrate 120 including a transparent electrode 121 and optionally a black matrix 121*a*. The black matrix 121*a* formed between the transparent electrodes 121 is not required, but the black matrix 121*a* not only improves purity and contrast, but also removes unevenness resulting from the transparent electrode 121 so that the electrode material layer 102 is well laminated.

Figure 5D:
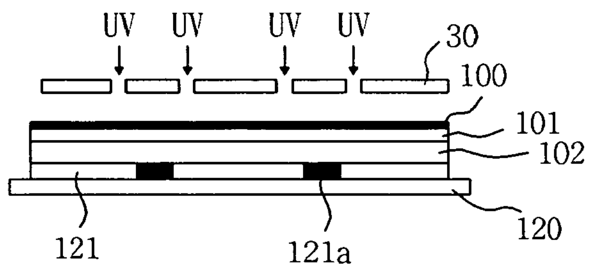

As shown in FIG. 5D, the photoresist layer 101 of the sheet 110 laminated on the glass substrate 120 is exposed to ultraviolet rays (UV) irradiated through a photo mask 30.

Figure 5E:
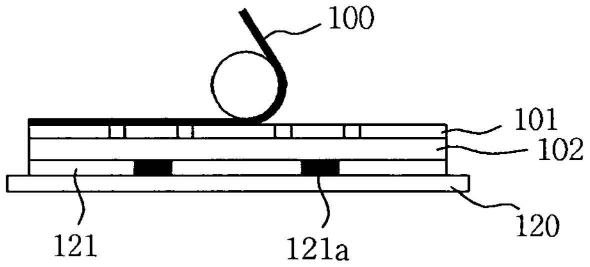
Figure 5F:
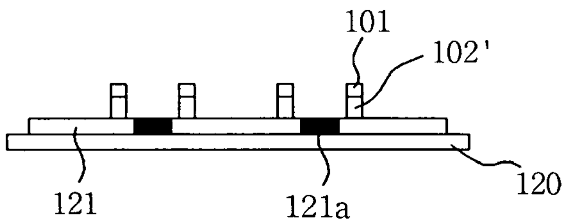

As shown in FIG. 5E, the base film 100 is removed from a surface of the exposed sheet 110, and then as shown in FIG. 5F, the resultant is developed by a developer, thereby forming an electrode 102'.

Figure 5G:
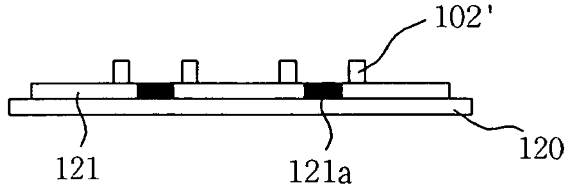

As shown in FIG. 5G, the resultant is fired for about three hours at more than a predetermined temperature, thereby forming the patterned electrode 102' of the plasma display apparatus. The electrode 102' is the bus electrode.

The electrode 102' is formed using the sheet 110 instead of the screen printing method and therefore, a screen mask is not needed.

Since the electrode is formed using the sheet 110 instead of the screen printing method, the sheet 110 can be adapted for a large size of the plasma display apparatus while also being useful for a multi-panel production process.

In a case where the electrode is formed using the sheet 110, the bus electrode is formed through one-time exposure, one-time developing, and one-time firing, thereby reducing manufacturing time and cost, due to the simplification of the manufacture process, in comparison to the conventional screen printing method using the screen mask.

If the sheet 110 is used, the electrode can be formed through the exposure process, thereby allowing the forming of a highly precise electrode pattern that had previously been difficult to be formed using the screen printing method.

Second Embodiment

Figure 6:
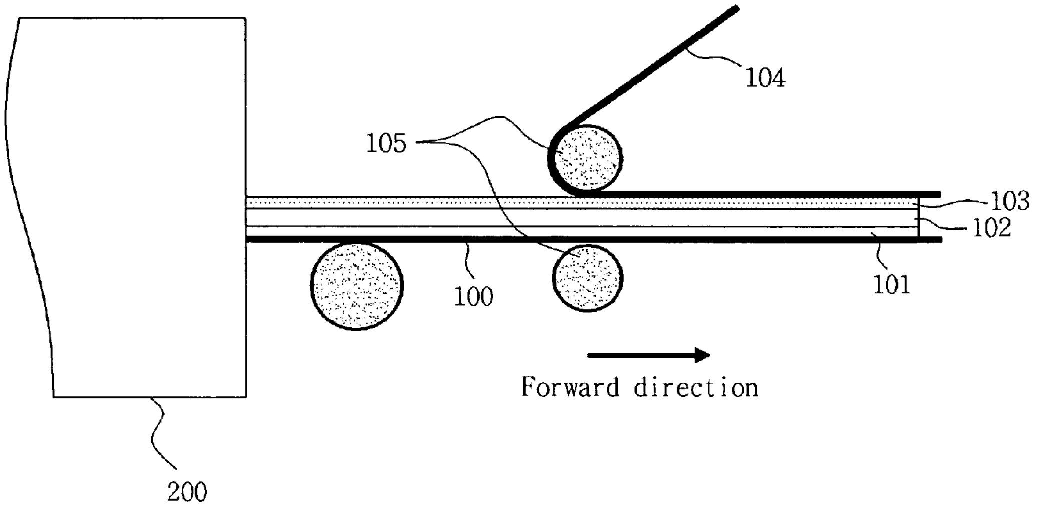
FIG. 6 illustrates a manufacturing method and a structure of a sheet according to the second embodiment of the present invention.

FIG. 6 illustrates a manufacturing method and a structure of a sheet according to the second embodiment of the present invention.

As shown in FIG. 6, the inventive sheet 110 includes a base film 100, a photoresist layer 101, an electrode material layer 102, a black material layer 103, and a cover film 104.

The base film 100 is disposed at the lowermost portion of the sheet 110. The photoresist layer 101 is formed on the base film 100. The electrode material layer 102 is formed on the photoresist layer 101. The black material layer 103 is formed on the electrode material layer 102. The cover film 104 is formed on the black material layer 103. The electrode material layer 102 for forming an electrode is comprised of silver (Ag). The black material layer 103 may be a photosensitive black material layer.

The inventive sheet 110 is formed using a tape caster 200. The tape caster 200 forwards the base film 100 in a direction of an arrow of FIG. 6 while casting the photoresist layer 101, the electrode material layer 102, and the black material layer 103 on the base film 100. Next, the tape caster 200 enables the base film 100 including the earlier casted photoresist layer 101, electrode material layer 102, and black material layer 103 to pass between two laminating rolls 105. The laminating rolls 105 are disposed up and down and spaced apart from each other, and laminate the cover film 104 on the black material layer 103 and complete the sheet 110.

FIGS. 7A to 7H illustrate an electrode manufacturing method using the sheet according to the second embodiment of the present invention.

Figure 7A:
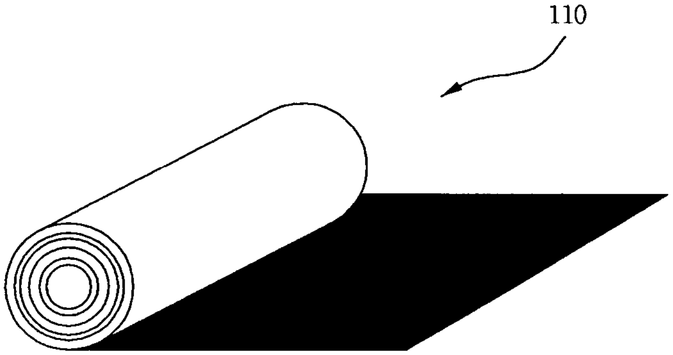
FIGS. 7A to 7H illustrate an electrode manufacturing method using a sheet according to the second embodiment of the present invention.

Referring to FIG. 7A, the sheet 110 for forming a bus electrode at a front substrate of a plasma display apparatus is formed by sequentially laminating the base film 100, the photoresist layer 101, the electrode material layer 102, the black material layer 103, and the cover film 104 as shown in FIG. 6.

Figure 7B:
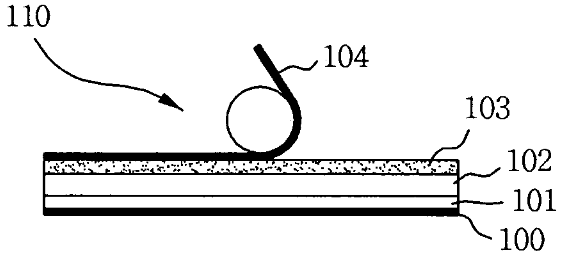
Figure 7C:
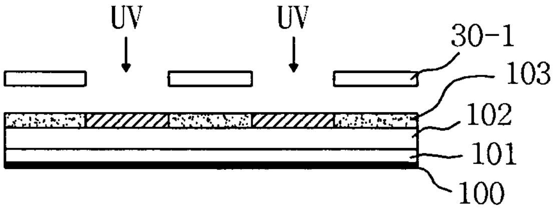

As shown in FIG. 7B, the cover film 104 is removed from the sheet 110. Upon the removal of the cover film 104, as shown in FIG. 7C, the black material layer 103 of the sheet is exposed to ultraviolet rays (UV) irradiated through a first photo mask 30-1. The first photo mask 30-1 is used to form a pattern of the black layer 103'.

Figure 7D:
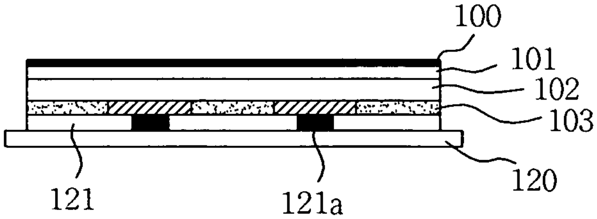

After the exposure, as shown in FIG. 7D, the black material layer 103 of the sheet 110 is laminated on a glass substrate 120 including a transparent electrode 121 and, optionally a black matrix 121*a*. The black matrix 121*a* formed between the transparent electrodes 121 is not required, but the black matrix 121*a* not only improves purity and contrast, but also removes unevenness resulting from the transparent electrode 121 so that the black material layer 103 is well laminated.

Figure 7E:
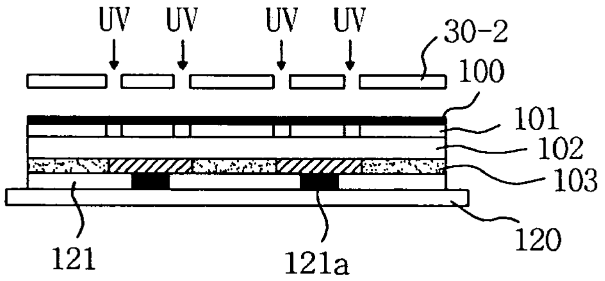

As shown in FIG. 7E, the photoresist layer 101 of the sheet 110 laminated on the glass substrate 120 is exposed to ultraviolet rays (UV) irradiated through a second photo mask 30-2.

Figure 7F:
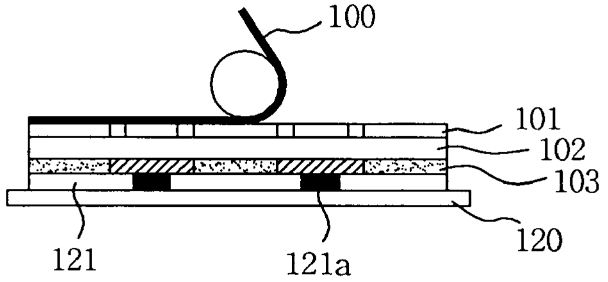
Figure 7G:
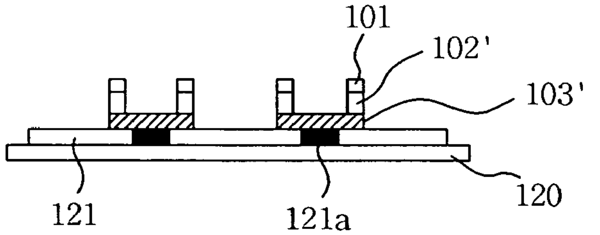

As shown in FIG. 7F, the base film 100 is removed from a surface of the exposed sheet 110 and then, as shown in FIG. 7G, the resultant is developed by a developer, thereby forming a black layer 103' and an electrode 102'. In other words, through one-time developing, the black layer 103' and the electrode 102' are concurrently formed. The electrode 102' is the bus electrode.

Figure 7H:
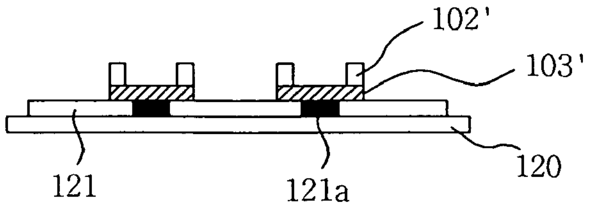

As shown in FIG. 7H, the resultant is then fired for about three hours at more than a predetermined temperature, thereby forming the patterned black layer 103' and electrode 102' of the plasma display apparatus.

The electrode 102' is formed using the sheet 110 instead of a screen printing method and therefore, a screen mask is not needed.

Since the electrode 102' is formed using the sheet 110 instead of the screen printing method, the sheet 110 can be adapted for a large size of the plasma display apparatus while also being useful for a multi-panel production process.

In a case where the electrode is formed using the sheet 110, the bus electrode is formed through two-time exposure, one-time developing, and one-time firing, thereby reducing manufacturing time and cost, due to the simplification of a manufacture process, in comparison to the conventional screen printing method using the screen mask.

If the sheet 110 is used, the electrode can be formed through the exposure process, thereby allowing the forming of a highly precise electrode pattern that had previously been difficult to be formed using the screen printing method.

The invention being thus described, may be varied in many ways. Such variations are not to be regarded as a departure from the spirit and scope of the invention, and all such modifications as would be obvious to one skilled in the art are intended to be included within the scope of the following claims.

What is claimed is:

1. A sheet for manufacturing a plasma display apparatus, the sheet comprising, in sequential order:

a base film;

a photoresist layer formed on the base film;

an electrode material layer formed on the photoresist layer; and a cover film formed on the electrode material layer.

2. The sheet of claim 1, wherein the electrode material layer is comprised of silver (Ag).

3. A sheet for manufacturing a plasma display apparatus, the sheet comprising, in sequential order:

a base film;

a photoresist layer formed on the base film;

an electrode material layer formed on the photoresist layer;

a black material layer formed on the electrode material layer; and a cover film formed on the black material layer.

4. The sheet of claim 3, wherein the electrode material layer is comprised of silver (Ag).

5. The sheet of claim 3, wherein the black material layer is a photosensitive black material layer.

6. A method for manufacturing a plasma display apparatus using a sheet, the method comprising the steps of:

exposing a black material layer as claimed in claim 3, using a first photo mask;

preparing a glass substrate;

laminating the exposed black material layer over the glass substrate;

laminating a photoresist layer on the sheet, and exposing the laminated photoresist layer using a second photo mask; and developing the the exposed photoresist layer, and forming a black layer positioned over the glass substrate and an electrode positioned on the black layer.

7. The method of claim 6, further comprising the step of: lifting off the cover film before the exposure is performed using the first photo mask.

8. The method of claim 6, further comprising the step of: lifting off the cover film after the exposure is performed using the first photo mask.

9. The method of claim 6, further comprising the step of: after the forming of the black layer and the electrode, firing the formed black layer and electrode.

10. The method of claim 6, wherein the black material layer is a photosensitive black material layer.

11. The method of claim 6, wherein the electrode material layer is comprised of silver (Ag).

12. The method of claim 6, wherein the exposed black material layer is laminated on the glass substrate having the transparent electrode formed thereon.

13. The method of claim 6, wherein the exposed black material layer is laminated on the glass substrate that has the transparent electrodes formed thereon and having a black matrix formed therebetween.

* * * * *